(12) United States Patent
Jenq

(10) Patent No.: US 6,884,671 B2
(45) Date of Patent: Apr. 26, 2005

(54) METHOD FOR FABRICATING A GATE ELECTRODE

(75) Inventor: Jason Jyh-Shyang Jenq, Ping-Tung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/655,866

(22) Filed: Sep. 5, 2003

(65) Prior Publication Data

US 2004/0048457 A1 Mar. 11, 2004

Related U.S. Application Data

(63) Continuation-in-part of application No. 10/141,870, filed on May 10, 2002, now abandoned.

(51) Int. Cl.⁷ .......................................... H01L 21/8234
(52) U.S. Cl. ...................... 438/197; 438/287; 438/585
(58) Field of Search ................................ 438/197, 287, 438/585, 591, 592

(56) References Cited

U.S. PATENT DOCUMENTS

| 5,880,508 | A | * | 3/1999 | Wu ............................. 257/411 |
| 6,251,761 | B1 | * | 6/2001 | Rodder et al. ............... 438/591 |
| 6,417,085 | B1 | * | 7/2002 | Batra et al. .................. 438/591 |
| 6,642,131 | B1 | * | 11/2003 | Harada ........................ 438/591 |

* cited by examiner

Primary Examiner—Tuan H. Nguyen
(74) Attorney, Agent, or Firm—Jean C. Edwards; Dickinson Wright, PLLC

(57) ABSTRACT

A method for fabricating a gate electrode is disclosed. The present invention is provided a method to utilize the first nitrogen-containing RTP treatment to treat the substrate to form a first barrier layer thereon. Then, the dielectric material has high dielectric constant that is deposited on the first barrier layer to improve the thermal stability and chemical stability of the semiconductor substrate. Next, a second barrier layer and a metal gate layer are sequentially formed on the dielectric layer. After a photolithography process, a gate electrode is formed on the semiconductor substrate. Thereafter, a surface inhibition layer is formed on sidewall of the gate electrode to improve the resistivity and thermal stability for metal gate layer after a second nitrogen-containing RTP treatment is performed on the gate electrode.

39 Claims, 4 Drawing Sheets

METHOD FOR FABRICATING A GATE ELECTRODE

This application is a continuation-in-part of U.S. patent application Ser. No. 10/141,870, filed May 10, 2002, now abandoned.

BACKGROUND OF THE INVENTION

1. Field of the Invention

The present invention generally relates to a method for fabricating a gate electrode on a substrate, and more particularly to a method for reducing the dielectric constant of gate electrode.

2. Description of the Prior Art

The use of conventional gate electrode and gate dielectric material is becoming increasingly problematic as feature sizes of semiconductor devices are continuing to be scaled to smaller dimensions. Among the problems encountered include increased resistance of the gate electrode, leakage of the gate dielectric, and polysilicon gate depletion effects. In an effort to overcome these problems, alternative materials are being investigated to replace conventional gate dielectric and gate electrode materials.

Refractory metals or refractory metal alloys, their nitrides, and aluminum are alternative materials currently being investigated for use as gate electrodes. These materials offer potential advantages over materials such as polysilicon because of their patternability, low sheet resistance, and scalability to advanced metal oxide semiconductor technologies. Among the refractory metals currently being considered include titanium, tantalum, tungsten, molybdenum, zirconium, or the like.

In selecting refractory metal materials for use as a gate electrode, a number of factors must be considered. Among these include the electric, chemical, and physical properties of the refractory metal material. The selection process is further complicated because these properties can change as the refractory metal material is subjected to various thermal processing steps. Failure to compensate for these thermally induced changes can impact yield and potentially affect the reliability of the semiconductor device.

In generally, after the isolation structure such as STI (shallow trench isolation) or LOCOS (local oxidation) formed in the substrate, the $SiO_2$ or SiN as a gate dielectric material is formed on the substrate. In order to increase the S/D current (source/drain current), therefore, the thickness of gate dielectric must be reduced. However the $SiO_2$ or SiN, has EOT (effective oxide thickness) is smaller than 17 angstrom such that the tunneling will be occurred, and further the gate leakage current will be increased extremely.

Further another disadvantage is that the dielectric material such as Hf (hafnium), Zr (zirconium), $La_2O_3$ (lanthanum oxide), $Y_2O_3$ (yttrium oxide), and Al-doped Zr-silicate $((Al_2O_3)(ZrO_2)_x(SiO_2)_{1-x-y}$ are deposited on the semiconductor device during the CMOS (complementary metal oxide semiconductor) process. The dielectric material has been attention for low resistivity, and the thermal and chemical stability are poor such as for Hf and Zr. Furthermore, other dielectric materials are used only for 100 nm CMOS (complementary metal oxide semiconductor) fabrication such as $Ta_2O_5$ (tantalum pentoxide) and PZT (Lead Zirconium Titanate).

SUMMARY OF THE INVENTION

The first object of the present invention is to increase the coupling ratio of gate electrode with first nitrogen-containing rapid thermal process (nitrogen-containing RTP) treatment during the fabrication of the CMOS (complementary metal oxide semiconductor) process.

The second object of the present invention is to provide the alternative dielectric material has a dielectric constant higher than 10 to form on the substrate to improve the thermal stability and chemical stability for the gate electrode.

The third object of the present invention is to provide a treatment to improve the quality of the gate dielectric film and gate electrode.

In the present invention, the leakage current and reliability is the most issue for the fabrication of the semiconductor device. In the present invention is that a method is provided to increase the coupling ratio of the gate electrode. The prevent invention is utilized the nitrogen-containing RTP treatment on the substrate to form an interface diffusion barrier layer thereon. The interface diffusion barrier layer is used to separate the dielectric layer and substrate in order to reduce the likelihood of adverse interactions between the two materials. Then, the invention is utilized the dielectric material to deposit on the interface diffusion barrier layer to improve the thermal stability and chemical stability of the semiconductor substrate. Next, the post-deposition annealing in nitrogen gas is performed on the dielectric layer to release the stress and reduce the interface charge. The leakage current will be reduced and the reliability and quality of semiconductor device are also to be improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
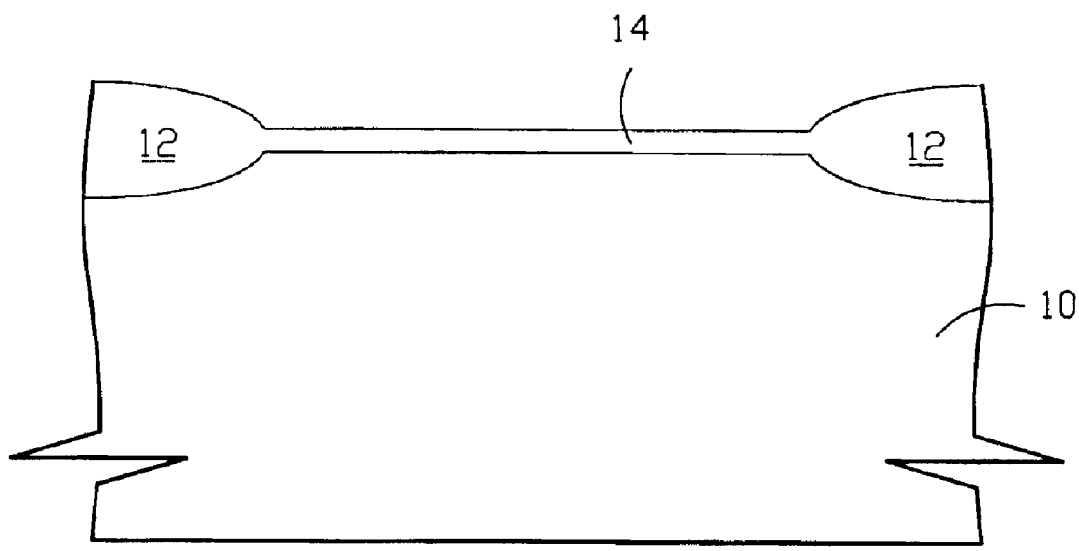
FIG. 1 is a schematic representation showing a field oxide region and a gate oxide layer on a substrate in accordance with a method disclosed herein.

Referring to FIG. 1, a $SiO_2$ layer (silicon dioxide layer) (not shown) is first formed on the substrate 10 by thermal oxidation method. Then, a SiN layer (silicon nitride layer) (not shown) is deposited on the $SiO_2$ layer by conventional chemical vapor deposition method, such as low-pressure chemical vapor deposition (LPCVD). Next, the active regions are now defined with a photolithography step. A photoresist layer is normally used to protect all of the areas where active devices will be formed. The SiN layer is then dry etched, and the $SiO_2$ layer is etched by means of either a dry- or wet-chemical process. After the $SiO_2$ layer has been etched, the photoresist layer is not removed but instead is left in place to serve as a masking layer during the formation of twin wells (not shown) and channel-stop implant step. The channel stop layer (not shown) is formed in the substrate 10 by conventional implanting process.

Next, after the photoresist layer is stripped, the field oxide 12 is thermally grown by means of wet oxidation. The oxide grows where there is no masking nitride, but at the edge of the nitride, some oxidant also diffuses laterally. This causes the oxide to grow under and lift the nitride edges. Because the shape of the oxide at the oxide edges is that of a slowly tapering oxide wedge that merges into the pad oxide, it has been named a bird's beak. The bird's beak is a lateral extension of the field oxide 12 into the active area of the devices. Then, a gate oxide 14 is grown on the substrate 10 by thermal oxidation method.

Figure 2:
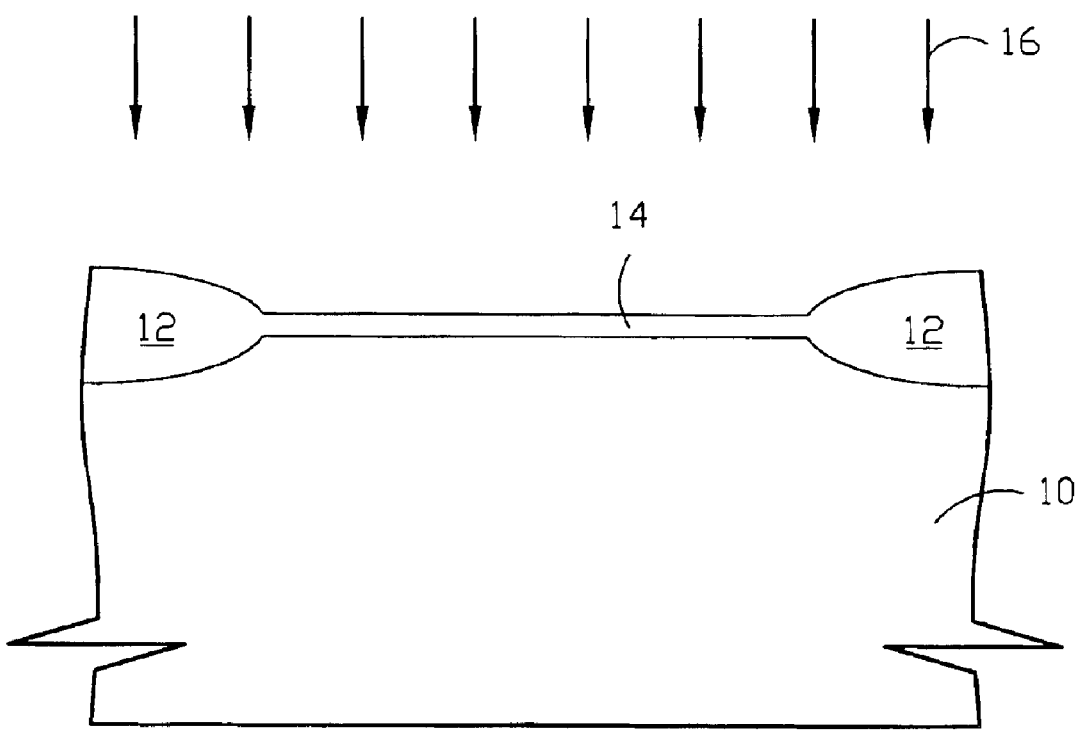
FIG. 2 is a schematic representation showing a first nitrogen-containing rapid thermal process (nitrogen-containing RTP) treatment performed on the semiconductor substrate in accordance with a method disclosed.
Figure 3:
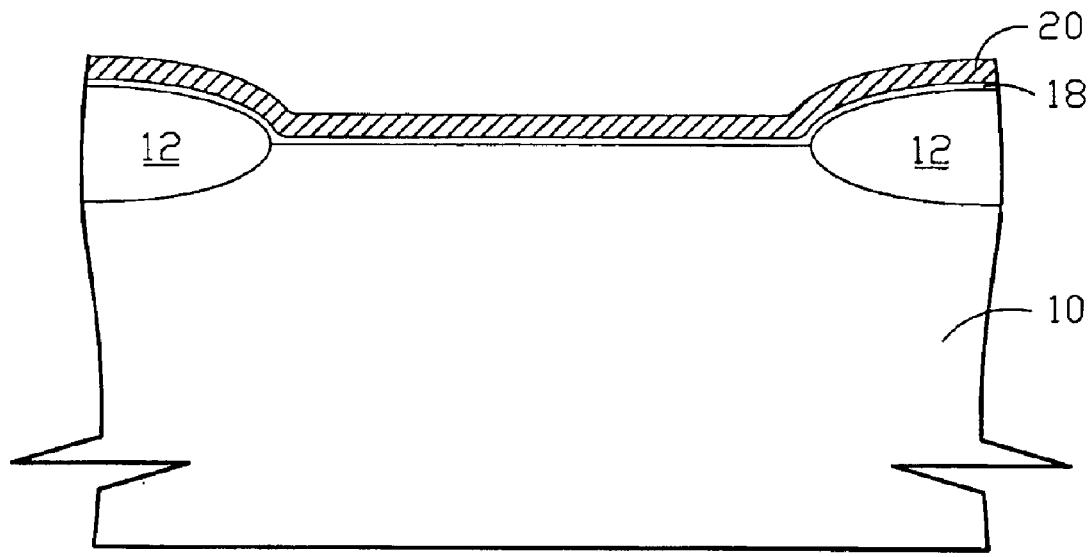
FIG. 3 is a schematic representation showing a first barrier layer is formed on the structure of FIG. 2 after the first ammonia rapid thermal process ($NH_3$ RTP) treatment, and a dielectric layer is deposited on the first barrier layer.

Next, referring to FIG. 2, in order to improve the quality of gate dielectric film and gate electrode, the prevent invention is provided a first nitrogen-containing RTP (nitrogen-containing rapid thermal process) treatment 16 to treat the substrate 10 to form a first barrier layer 18 over the substrate 10 as shown in FIG. 3. In the embodiment of the present invention, the nitrogen-containing gas can be $N_2$ gas (nitrogen gas) or $NH_3$ gas (ammonia gas). Then, the first barrier layer 18 used to separate the dielectric material and substrate 10 in order to reduce the likelihood of adverse interactions between the two materials. During the fist nitrogen-containing RTP treatment 16, the ammonia reacted with gate oxide 14 and substrate 10, wherein the material of the first barrier layer can be $SiO_2$, $SiON_y$, or $SiON_x$. The temperature of the first nitrogen-containing RTP treatment 16 is between 600° C. to 750° C. and the duration is between 10 to 20 minutes.

Figure 4:
FIG. 4 is a schematic representation showing a post-deposition annealing in nitrogen to treat the dielectric layer in accordance with a method disclosed.
Figure 4:
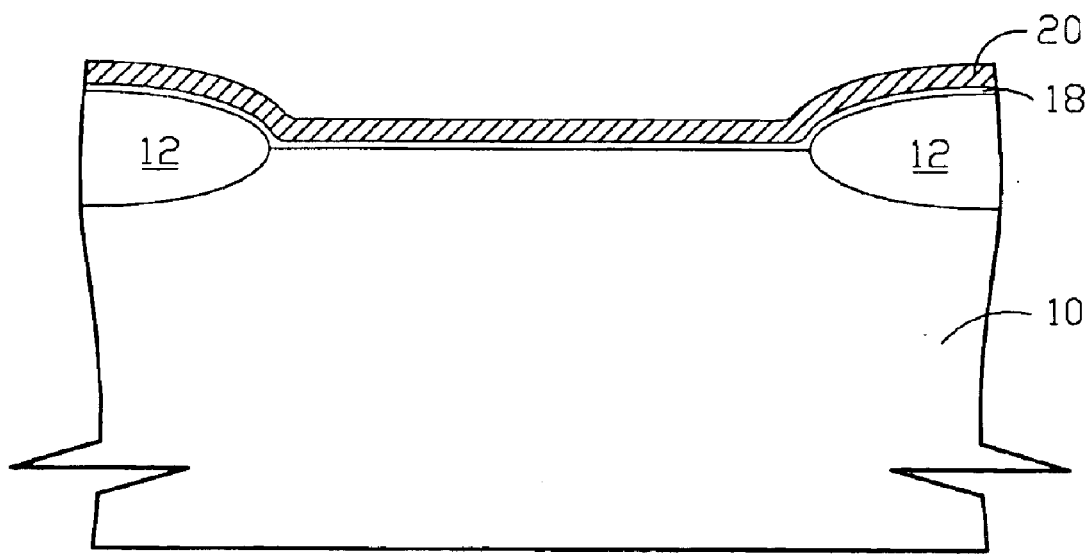

Then, referring to FIG. 3 and FIG. 4, a dielectric layer 20 has dielectric constant higher than 10 that is deposited on the first barrier layer 18 by a conventional chemical vapor deposition method. The material of dielectric layer 20 can be zirconium dioxide ($ZrO_2$), hafnium dioxide ($HfO_2$), zirconium-silicates (($ZrO_2)_x(SiO_2)_{1-x}$), hafnium-silicates ($HfO_2)_x(SiO_2)_{1-x}$), which are good candidates for high dielectric for their reasonable high dielectric constant, low resistivity, good thermal stability, and chemical stability, wherein the suffix x preferably 25% to 35%. Furthermore, other material of dielectric with higher dielectric constant is selected from the group consisting of $La_2O_3$ (lanthanum oxide), $Y_2O_3$ (yttrium oxide), and Al-doped Zr-silicate (($Al_2O_3)(ZrO_2)_x(SiO_2)_{1-x-y}$).

Next, the post deposition treatment of the present invention is a series of anneal steps that together improve the interface characteristics and electrical properties of deposited metal oxide dielectric film. Referring to FIG. 4, a post-deposition annealing in nitrogen 22 is treated on the dielectric layer 20 to release the stress and reduce the interface charge such that the gate leakage current will be reduced, wherein the temperature of the post-deposition annealing in nitrogen 22 is between 700° C. to 900° C. and the duration is between 20 to 45 minutes.

Figure 5:
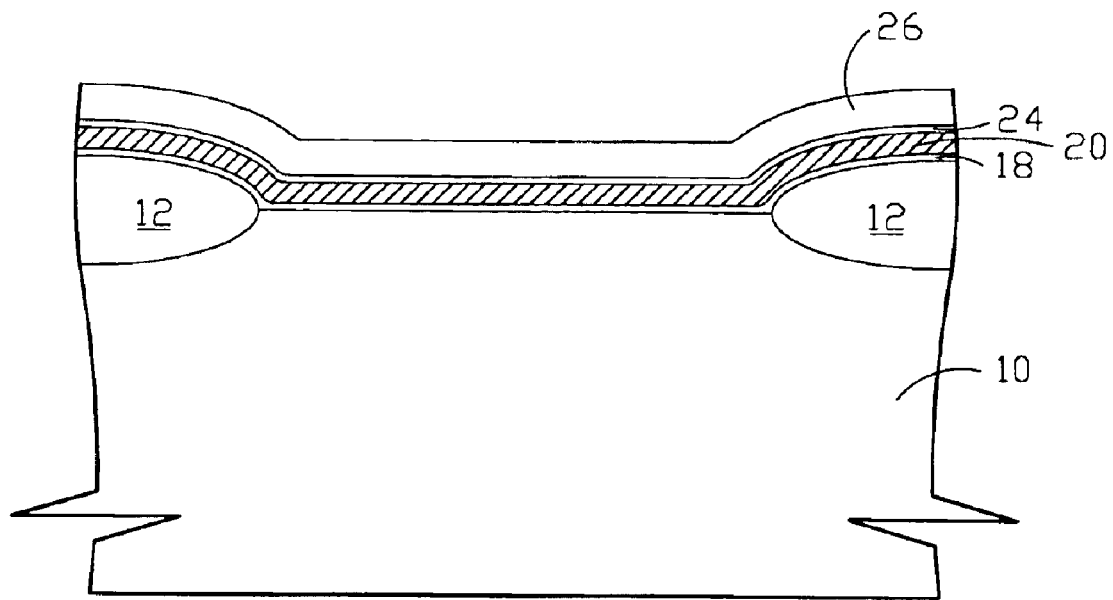
FIG. 5 is a schematic representation showing a second barrier layer and a metal gate layer formed on the structure of FIG. 4 in accordance with a method disclosed.

Then, referring to FIG. 5, in order to reduce the diffuse of oxygen atom to metal gate layer 26 in high thermal temperature, in the present invention, the a second barrier layer 24 is first deposited on the dielectric layer 20. In the preferred embodiment of the present invention, the material of the second barrier layer 24 can be $TiN_x$ or $TaN_x$ with thickness 20 to 60 angstroms, herein the second barrier layer 24 can be an optional deposition step. Thereafter, a metal gate layer 26 is then deposited on the second barrier layer 24. Herein, the metal gate layer 26 has advantage for its low resistivity, good thermal and chemical stability. The material of the metal gate layer 26 is selected from the group consisting of tantalum (Ta), tantalum nitride ($TaN_x$), and $TaRu_xN_y$ (tantalum-ruthenium-nitrogen). The suffix x can be adjust to adjust the work function of gate electrode. Furthermore, in CMOS (complementary-metal-oxide-semiconductor), the different work function of gate is necessary, the suffix x of $TaN_x$ can be adjust, such that the suitable work function can be obtained for PMOS and NMOS.

Figure 6:
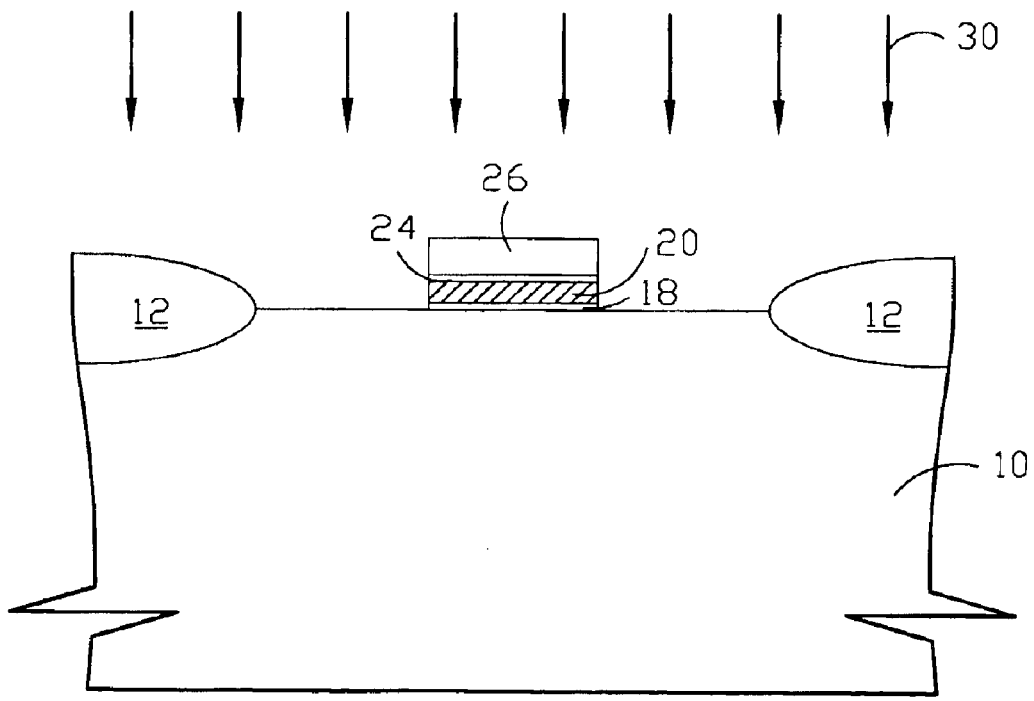
FIG. 6 is a schematic representation showing a second nitrogen-containing rapid thermal process (nitrogen-containing RTP) to treat a gate electrode after the gate electrode is formed on the substrate in accordance with a method disclosed.

Next, referring to FIG. 6, a photoresist layer (not shown) is formed on the metal gate layer 26, and an etching process is performed on the metal gate layer 26, second barrier layer 24, the dielectric layer 20, and the first barrier layer 18 to form a gate electrode on the substrate 10.

Figure 7:
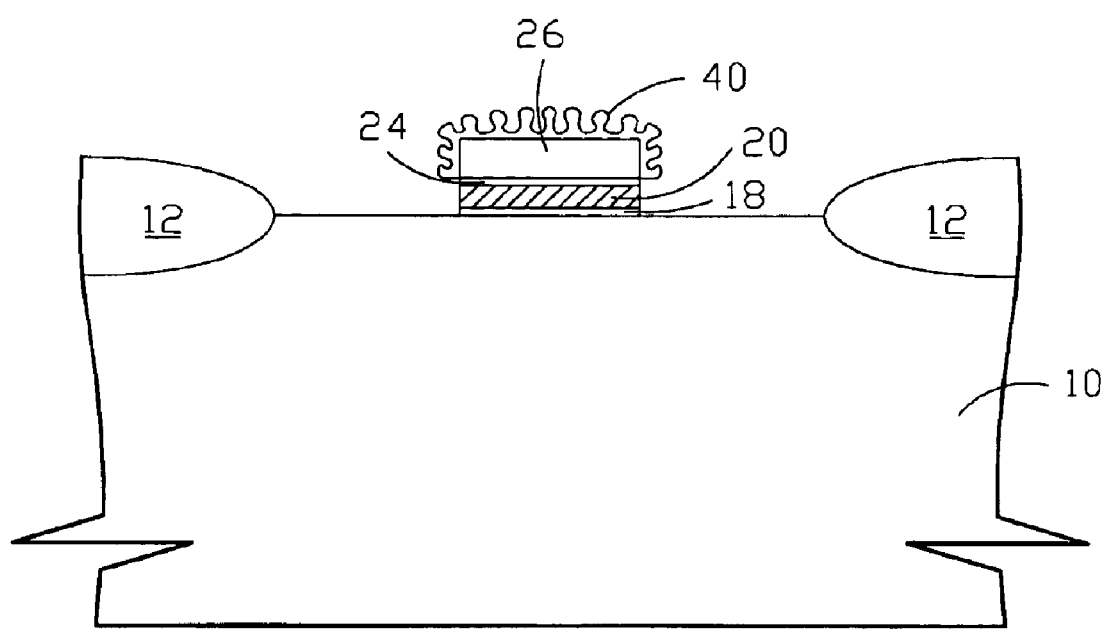
FIG. 7 is showing a schematic representation showing a surface inhibition layer on the sidewall of the gate electrode in accordance with a method disclosed.

Next, the second nitrogen-containing RTP treatment 30 is performed on the gate electrode with temperature at 600° C. and the duration of the process is about 20 minutes to form a surface inhibition layer 40 such as $TaN_x$ film on the sidewall of the metal gate layer 26 of the gate electrode (shown in FIG. 7). Due to the surface inhibition layer 40 is formed on the surface of metal gate layer 26, therefore, the Ta, $TaN_x$, or $TaRu_xN_y$ server as a metal gate layer 26 has a low resistivity and good thermal stability, especially with the nitrogen-containing RTP treatment.

According to above-mentioned, the dielectric layer 20 is utilized to improve the quality of gate electrode for their reasonable high dielectric constant, good thermal stability, and chemical stability. Furthermore, the metal gate layer 26 has low resistivity, good thermal and chemical stability to serve as a metal gate material, especially with nitrogen-containing RTP treatment such that the quality and reliability of gate electrode can be improved.

Although specific embodiments have been illustrated and described, it will be obvious to those skilled in the art that various modifications may be made without departing from what is intended to be limited solely by the appended claims.

What is claimed is:

1. A method for fabricating a gate electrode, wherein said method comprises:
    providing a substrate;
    forming a first barrier layer on said substrate;
    forming a dielectric layer with a high dielectric constant on said first barrier layer;
    performing a post-deposition annealing to said dielectric layer;
    depositing a second barrier layer on said dielectric layer;
    forming a metal gate layer on said barrier layer; and
    removing a portion of said metal gate layer, said second barrier layer, said dielectric layer, and said first barrier layer to form a gate electrode on said substrate.

2. The method according to claim 1, wherein the step of forming said first barrier layer comprises a first nitrogen-containing rapid thermal process.

3. The method according to claim 2, wherein said first nitrogen-containing rapid thermal process further comprises an ammonia rapid thermal process.

4. The method according to claim 2, wherein the temperature of said first nitrogen-containing rapid thermal process is between 600° C. to 750° C.

5. The method according to claim 2, wherein the duration of said first nitrogen-containing rapid thermal process is between 10 and 20 minutes.

6. The method according to claim 1, wherein the material of said first barrier layer is selected from the group consisting of silicon dioxide ($SiO_2$), silicon nitride ($SiN_x$), and silicon oxynitride (SiON).

7. The method according to claim 1, wherein the material of said dielectric layer is selected from the group consisting of zirconium dioxide ($ZrO_2$), hafnium dioxide ($HfO_2$), zirconium silicates (Zr-silicates), hafnium silicates (Hf-silicates), $La_2O_3$ (lanthanum oxide), $Y_2O_3$ (yttrium oxide), and Al-doped Zr-silicate (($Al_2O_3$)($ZrO_2$)$_x$($SiO_2$)$_{1-x-y}$).

8. The method according to claim 1, wherein said dielectric layer with said high dielectric constant is about 10.

9. The method according to claim 1, wherein the steps of said fabricating said gate electrode on said substrate further comprises:
performing a post-deposition annealing to said dielectric layer;
depositing a second barrier layer on said dielectric layer;
depositing a metal gate layer on said second barrier layer;
forming a photoresist layer on said metal gate layer; and
sequentially etching said metal gate layer, said second barrier layer, said dielectric layer, and said first barrier layer to form a gate electrode on said substrate.

10. The method according to claim 1, wherein the temperature of said post-deposition annealing is between 700° C. to 900° C.

11. The method according to claim 1, wherein the duration of said post-deposition annealing is between 20 to 45 minutes.

12. The method according to claim 1, wherein the material of said second barrier layer is seiected from the group consisting of $TiN_x$ and $TaN_x$.

13. The method according to claim 1, further comprising a second nitrogen-containing rapid thermal process treatment to treat said gate electrode.

14. The method according to claim 13, wherein said second nitrogen-containing rapid thermal process comprises an ammonia rapid thermal process.

15. The method according to claim 1, wherein the material of said metal gate layer is selected from the group consisting of tantalum (Ta), tantalum nitride ($TaN_x$), and $TaRu_xN_y$ (tantalum-ruthenium-nitrogen).

16. A method for fabricating a gate electrode, said method comprising:
providing a substrate;
treating said substrate by a first nitrogen-containing rapid thermal process to form a first barrier layer thereon;
depositing a dielectric layer with a high dielectric constant on said first barrier layer;
performing a post-deposition annealing process on said dielectric layer;
forming a second barrier layer on said dielectric layer;
forming a metal gate layer on said second barrier layer;
forming a photoresist layer on said metal gate layer;
sequentially etching said metal gate layer, said second barrier layer, said dielectric layer, and said first barrier layer to form a gate electrode on said substrate; and
performing a second nitrogen-containing rapid thermal process on said gate electrode.

17. The method according to claim 16, wherein said first nitrogen-containing rapid thermal process further comprises an ammonia rapid thermal process.

18. The method according to claim 16, wherein the temperature of said first nitrogen-containing rapid thermal process ($NH_3$ RTP) is between 600° C. to 750° C.

19. The method according to claim 16, wherein the duration of said first nitrogen-containing rapid thermal process is between 10 to 20 minutes.

20. The method according to claim 16, wherein the material of said first barrier layer is selected from the group consisting of silicon dioxide ($SiO_2$), silicon nitride ($SiN_x$), and SiON (silicon oxynitride).

21. The method according to claim 16, wherein said dielectric layer is selected from the group consisting of zirconium dioxide ($ZrO_2$), hafnium dioxide ($HfO_2$), zirconium silicates (Zr-silicates), hafnium silicates (Hf-silicates, $La_2O_3$ (lanthanum oxide), $Y_2O_3$ (yttrium oxide), and Al-doped Zr-silicate (($Al_2O_3$)($ZrO_2$)$_x$($SiO_2$)$_{1-x-y}$).

22. The method according to claim 16, wherein said dielectric layer with said high dielectric constant is about 10.

23. The method according to claim 16, wherein said performing post-deposition annealing comprises a post-deposition annealing in nitrogen gas.

24. The method according to claim 23, wherein the temperature of said post-deposition annealing is between 700° C. to 900° C.

25. The method according to claim 23, wherein the duration of said post-deposition annealing is between 20 to 45 minutes.

26. The method according to claim 16, wherein the material of said second barrier layer is selected from the group consisting of silicon dioxide ($SiO_2$), silicon nitride ($SiN_x$), and SiON (silicon oxynitride).

27. The method according to claim 16, wherein the material of said metal gate layer is selected from the group consisting of tantalum (Ta), tantalum nitride ($TaN_x$), and $TaRu_xN_y$ (tantalum-ruthenium-nitrogen).

28. The method according to claim 16, wherein said second nitrogen-containing rapid thermal process further comprising an ammonia rapid thermal process.

29. A method for forming the gate electrode, said method comprising:
providing a substrate;
treating said substrate by a first ammonia rapid thermal process ($NH_3$ RTP) to form a first barrier layer on said substrate;
chemical vapor depositing a dielectric layer on said first barrier layer, wherein the dielectric constant of said dielectric layer is about 10;
performing a post-deposition annealing in nitrogen gas on said dielectric layer;
chemical vapor depositing a second barrier layer on said dielectric layer;
chemical vapor depositing a metal gate layer on said second barrier layer;
forming a photoresist layer on said metal gate layer;
sequentially etching said metal gate layer, said second barrier layer, said dielectric layer, and said first barrier layer to form a gate electrode on said substrate; and performing a second ammonia rapid thermal process (NH$_3$ RTP) on said gate electrode to form a surface inhibition layer on the sidewall of said gate electrode.

30. The method according to claim 29, wherein the temperature of said first ammonia rapid thermal process (NH$_3$ RTP) is between 600° C. to 750° C.

31. The method according to claim 29, wherein the duration of said first ammonia rapid thermal process (NH$_3$ RTP) is between 10 to 20 minutes.

32. The method according to claim 29, wherein material of said first barrier layer is selected from the group consisting of silicon dioxide (SiO$_2$), silicon nitride (SiN$_x$), and silicon oxynitride (SiON).

33. The method according to claim 29, wherein said dielectric layer is selected from the group consisting of zirconium dioxide (ZrO$_2$), hafnium dioxide (HfO$_2$), zirconium silicates (Zr-silicates), and hafnium silicates (Hf-silicates), and La$_2$O$_3$ (lanthanum oxide), Y$_2$O$_3$ (yttrium oxide), and Al-doped Zr-silicate ((Al$_2$O$_3$)(ZrO$_2$)$_x$(SiO$_2$)$_{1-x-y}$).

34. The method according to claim 29, wherein the temperature of said post-deposition annealing is between 700° C. to 900° C.

35. The method according to claim 29, wherein the duration of said post-deposition annealing is between 20 to 45 minutes.

36. The method according to claim 29, wherein the material of said second barrier layer is selected from the group consisting of TiN$_x$ and TaN$_x$.

37. The method according to claim 29, wherein the temperature of said second ammonia rapid thermal process is about 600° C. .

38. The method according to claim 29, wherein the duration of said second ammonia rapid thermal process is about 20 minutes.

39. The method according to claim 29, wherein said surface inhibition layer comprises TaN$_x$.

* * * * *